(12) United States Patent
Yin et al.

(10) Patent No.: US 7,902,826 B2
(45) Date of Patent: Mar. 8, 2011

(54) TRANSVERSE GRADIENT COIL FOR MRI SYSTEMS AND METHOD FOR MANUFACTURING THE SAME

(75) Inventors: Weijun Yin, Niskayuna, NY (US); Bruce Campbell Amm, Clifton Park, NY (US); Kathleen Melanie Amm, CliftonPark, NY (US); Tunc Icoz, Schenectady, NY (US); Yogen Vishwas Utturkar, Niskayuna, NY (US); Wensen Wang, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 130 days.

(21) Appl. No.: 12/333,423

(22) Filed: Dec. 12, 2008

(65) Prior Publication Data

US 2010/0148779 A1    Jun. 17, 2010

(51) Int. Cl.
*G01V 3/00* (2006.01)
(52) U.S. Cl. ....................................................... 324/318
(58) Field of Classification Search .................. 324/318, 324/322
See application file for complete search history.

(56) References Cited

U.S. PATENT DOCUMENTS

| | | | |
|---|---|---|---|
| 5,235,279 A | 8/1993 | Kaufman et al. | |
| 5,235,283 A | 8/1993 | Lehne et al. | |
| 5,334,937 A | 8/1994 | Peck et al. | |
| 5,349,744 A | 9/1994 | Takahashi | |
| 5,563,567 A | 10/1996 | Westphal | |
| 5,793,209 A | 8/1998 | Kondo et al. | |
| 5,942,898 A | 8/1999 | Petropoulos | |
| 6,262,576 B1 | 7/2001 | Petropoulos | |
| 6,320,384 B1 | 11/2001 | Doty et al. | |
| 6,441,614 B1 | 8/2002 | Edelstein et al. | |
| 6,642,717 B2 * | 11/2003 | Dietz et al. | 324/318 |
| 6,741,152 B1 | 5/2004 | Arz et al. | |
| 6,774,631 B2 | 8/2004 | Heid | |
| 6,977,501 B2 * | 12/2005 | Kassai et al. | 324/315 |
| 7,135,863 B2 | 11/2006 | Arik et al. | |
| 7,154,270 B2 * | 12/2006 | Arz et al. | 324/318 |
| 7,522,027 B2 * | 4/2009 | Calvert et al. | 335/299 |
| 7,528,604 B2 * | 5/2009 | Gromoll et al. | 324/318 |
| 7,554,326 B2 * | 6/2009 | Sakakura | 324/318 |
| 2002/0008516 A1 | 1/2002 | Dietz et al. | |
| 2002/0097052 A1 | 7/2002 | Minas et al. | |
| 2005/0035764 A1 | 2/2005 | Mantone et al. | |
| 2005/0093543 A1 | 5/2005 | Arik et al. | |
| 2005/0146330 A1 | 7/2005 | Teklemariam et al. | |
| 2005/0168222 A1 | 8/2005 | Arz et al. | |
| 2005/0179435 A1 | 8/2005 | Coughlin | |
| 2008/0284262 A1* | 11/2008 | Nelson et al. | 310/52 |

FOREIGN PATENT DOCUMENTS

| | | |
|---|---|---|
| EP | 0766095 A1 | 4/1997 |
| EP | 0913699 A3 | 4/2008 |
| WO | 2005029111 A1 | 3/2005 |

* cited by examiner

*Primary Examiner* — Louis M Arana
(74) *Attorney, Agent, or Firm* — Jason K. Klindtworth (57) ABSTRACT

A transverse gradient coil for an MRI system is provided. The transverse gradient coil comprises a first coil layer; and an insulation layer made of thermoplastic insulation resin which has a thermal conductivity greater than 1.5 W/m·K, the insulation layer having one side bonded to the first coil layer. A method for manufacturing the transverse gradient coil by injection molding or compression molding is also provided.

24 Claims, 9 Drawing Sheets

TRANSVERSE GRADIENT COIL FOR MRI SYSTEMS AND METHOD FOR MANUFACTURING THE SAME

BACKGROUND OF THE INVENTION

1. Field of the Invention

The present invention relates to a transverse gradient coil of a gradient coil assembly for a magnetic resonance imaging (MRI) system, and a method of manufacturing the transverse gradient coil.

2. Description of the Related Art

In known MRI systems, gradient coils are used to vary the strength of the magnetic field in particular locations of an imaging volume by introducing a constant gradient in a primary magnetic field. In this manner, particular regions of a sample may be selected for analysis.

In an effort to achieve significantly higher performance in MRI systems, the level of the current applied to the coils recently has been substantially raised. However, the increased current level produces a significant amount of heat. This heat has to be carried away to prevent damages to the coils, to avoid unwanted changes in the magnetic field due to heating of magnet components and to prevent unacceptable heating to the patient and other subjects in the MRI system.

Conventional transverse gradient coils are typically made with copper sheet backed with epoxy-glass resin substrate, so as to achieve insulation and structural performance. However, the epoxy-glass resin substrate limits thermal conduction because of its low thermal conductivity, about 0.2 W/m·K, so that it disadvantageously blocks the heat to be conducted away from the copper sheet and then taken away by cooling fluid in the cooling tubes in the remainder part of the gradient coil assembly. A plurality of cooling tubes are required to be embedded in the gradient coil assembly but cooling efficiency is highly constrained by epoxy-glass resin substrate.

Although several conventional approaches are developed to improve the cooling efficiency of the gradient assembly, including improving the cooling design or improving the thermal conductivity of the thermal conductivity of the material around cooling tubes, none of the conventional approaches addresses to improvement in the thermal conductivity of the insulation layer within a transverse gradient coil.

BRIEF DESCRIPTION

In one aspect, a transverse gradient coil for an MRI system is provided. The transverse gradient coil comprises a first coil layer and an insulation layer made of thermoplastic insulation resin which has a thermal conductivity greater than 1.5 W/m·K. The insulation layer has one side thereof bonded to the first coil layer.

In another aspect, a method for manufacturing a transverse gradient coil for an MRI system is provided. The method includes: providing an injection mold which includes a bottom mold and a top mold with coil grooves being formed in at least one of the bottom mold and the top mold; winding a copper conductor about coil grooves to form at least one coil layer of the transverse gradient coil; pre-treating the injection mold; injecting melted thermoplastic insulation resin into the injection mold to form an insulation layer bonding to the at least one coil layer, wherein the thermoplastic insulation resin has a thermal conductivity greater than 1.5 W/m·K.

In yet another aspect, a method for manufacturing a transverse gradient coil for an MRI system is provided. The method includes: providing an compression mold which includes a bottom mold and a top mold with coil grooves being formed in at least one of the bottom mold and the top mold; winding a copper conductor about the coil grooves to form at least one coil layer; filling pellets or powder of a thermoplastic insulation resin into the compression mold, wherein the thermoplastic insulation resin has a thermal conductivity greater than 1.5 W/m·K; pressing the compression mold at a temperature higher than the glass transition temperature of the thermoplastic insulation resin but lower than its melting point until the pellets or powder is compressed to a desired dimension and bonded to the at least one coil layer.

In yet another aspect, a method for manufacturing a transverse gradient coil for an MRI system is provided. The method includes: providing a flat compression mold in rectangular shape comprising a top mold and a bottom mold; placing a first copper sheet at the bottom of the bottom mold; filling pellets or powder of a thermoplastic insulation resin into the bottom mold, wherein the thermoplastic insulation resin has a thermal conductivity greater than 1.5 W/m·K; laying a second copper sheet on the pellets or powder; connecting the top mold to the bottom mold; pressing the compression mold at a temperature higher than the glass transition temperature of the thermoplastic insulation resin but lower than its melting point until the pellets or powder is compressed to a desired dimension and bonded to the first copper sheet and the second copper sheet so as to form a coil plate.

BRIEF DESCRIPTION OF DRAWINGS

In the various views of the drawings, like reference characters designate like or similar parts.

DETAILED DESCRIPTION

Figure 1:
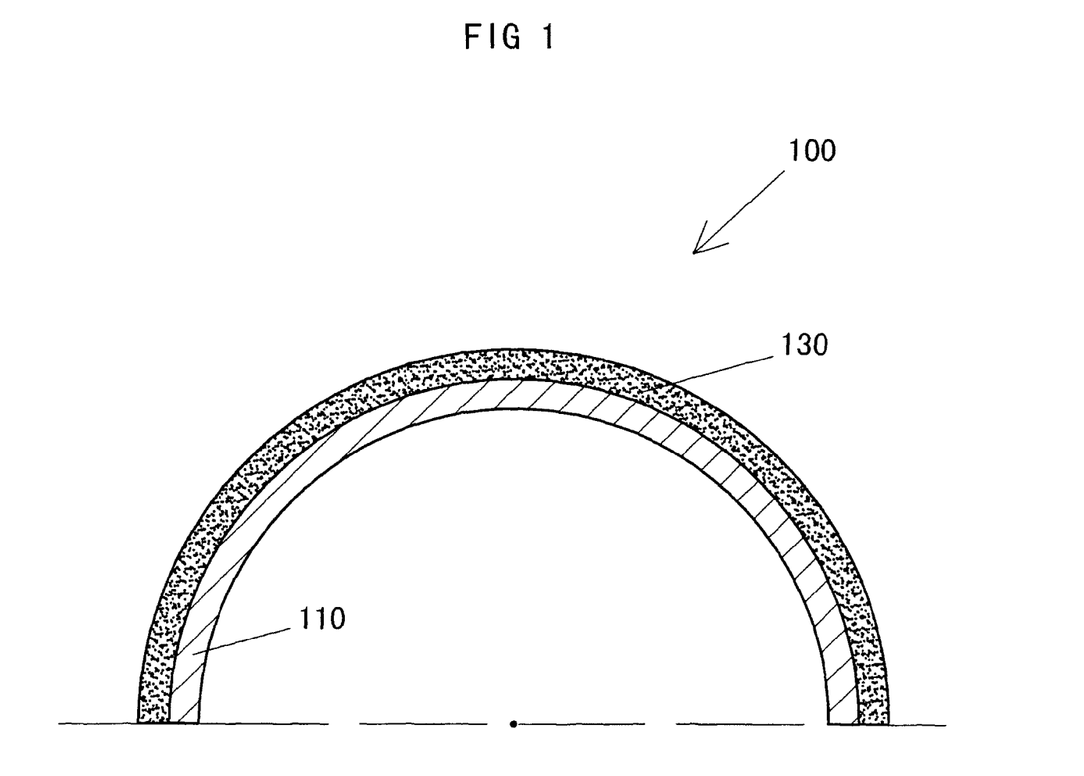
FIG. 1 is a schematic sectional view of a transverse gradient coil according to one embodiment of the invention.

A gradient coil assembly for an MRI system (not shown) includes an X-coil, a Y-coil and a Z-coil, wherein the X-coil and the Y-coil are also called transverse gradient coils. FIG. 1 shows a transverse gradient coil 100 as a part of a gradient coil assembly for an MRI system (not shown) according to one embodiment. The transverse gradient coil 100 comprises a coil layer 110 and an insulation layer 130, one side of which is bonded to the coil layer 110. A coil pattern, for example the pattern for the X-coil, is formed in the coil layer 110. In one embodiment, both the coil layer 110 and the insulation layer 130 comprise an arc shape and are disposed in a concentric arrangement with respect to a common axis A.

In one embodiment, the insulation layer 130 may be made of thermally conductive thermoplastic insulation resin, which could be selected from the group including but not limited to ceramic filled polypropylene, ceramic filled polyphenylene sulfide (PPS), ceramic filled polybutylene terephthalate (PBT) and ceramic filled polyamide, so as to provide insulation, mechanical performance, and high thermal conductivity for the transverse gradient coil.

An example of ceramic filled polypropylene is COOLPOLY® D1202 available from Cool Polymers, Inc.

Examples of ceramic filled polyphenylene sulfide (PPS) are THERMA-TECH™ SF-5000C TC available from Polyone Corporation and COOLPOLY® D5110 available from Cool Polymers, Inc.

An example of ceramic filled polybutylene terephthalate (PBT) is COOLPOLY® D4302 available from Cool Polymers, Inc.

Examples of ceramic filled polyamide are COOLPOLY® D3604 (i.e. ceramic filled polyamide 4,6) available from Cool Polymers, Inc, THERMA-TECH™ NN-5000C TC (i.e. ceramic filled polyamide 6/6) available from Polyone Corporation, and THERMA-TECH™ NJ-6000C TC (i.e. ceramic filled polyamid 12) available from Polyone Corporation.

Typical properties of COOLPOLY® D1202 are set forth in TABLE 1.

TABLE 1

| Thermal conductivity | 5 W/m · K |
|---|---|
| Tensile Modulus | 770 ksi |
| Tensile Strength | 3480 psi |
| Flexural Modulus | 900 ksi |
| Nominal strain at break | 0.57% |
| Flexural strength | 6200 psi |

Typical properties of COOLPOLY® D3604 are set forth in TABLE 2.

TABLE 2

| Thermal conductivity | 2.5 W/m · K |
|---|---|
| Tensile Modulus | 1396 ksi |
| Tensile Strength | 10165 psi |
| Flexural Modulus | 1161 ksi |
| Nominal strain at break | 1.3% |
| Flexural strength | 16385 psi |

Typical properties of THERMA-TECH™ NN-5000C TC are set forth in TABLE 3.

TABLE 3

| Thermal conductivity | 5 W/m · K |
|---|---|
| Tensile Modulus | 2100 ksi |
| Tensile Strength | 7400 psi |
| Flexural Modulus | 1630 ksi |
| Nominal strain at break | 0.8% |
| Flexural strength | 12900 psi |

In one embodiment, the thermal conductivity of the thermoplastic insulation resins applied for the transverse gradient coils is greater than 1.5 W/m·K. In one embodiment, the thermal conductivity of the thermoplastic insulation resins applied for the transverse gradient coils is greater than 2.5 W/m·K.

By increasing the thermal conductivity of the insulation layer 130 from conventional 0.5 W/m·K to above 1.5 W/m·K, the conduction thermal resistance is reduced by 2.1 times. By increasing the thermal conductivity of the insulation layer 130 from conventional 0.5 W/m·K to above 2.5 W/m·K, the conduction thermal resistance is reduced by 3.5 times.

This reduction in thermal resistance of the transverse gradient coil causes the gradient coil assembly formed thereby to operate at a temperature significantly lower than that of the conventional gradient coil assembly with the same cooling design. That is, the cooling efficiency of the gradient coil is improved. This improved cooling efficiency can lead to simpler and cost effective cooling designs of the gradient coil assembly arranged outside the transverse gradient coil. Furthermore, a simple cooling design will in turn lead to a compact gradient coil assembly and therefore a larger bore size, so that greater patient space can be obtained through this compact gradient coil system. Alternatively, this improved cooling efficiency can also be used to drive the gradient coils with higher currents, without overheating the coils, providing for better imaging quality.

In one embodiment, it may be preferable for the thermoplastic insulation resins applied for the transverse gradient coil also meet the criteria set forth in the TABLE 4. The mechanical strength of the resin is needed to sustain Lorenz forces generated by the gradient coil when it is energized. Low thermal expansion is needed to minimize delamination from copper and cracks due to mismatch of thermal expansion of resin material and copper coil. Breakdown strength is needed to sustain the electric field between gradient coils.

TABLE 4

| Property | Value | Units |
|---|---|---|
| Tensile modulus | >700 | Ksi |
| Tensile strength | >3 | Ksi |
| Linear thermal shrinkage from 125° C. to 20° C. | <1.2 | % |
| Breakdown strength | >400 | V/mil |
| Thermal expansion coefficient from 20° C. to 80° C. | <40 | micrometer/meter.° C. |

In one embodiment, the transverse gradient coil 100 can be manufactured by injection molding.

Figure 2:
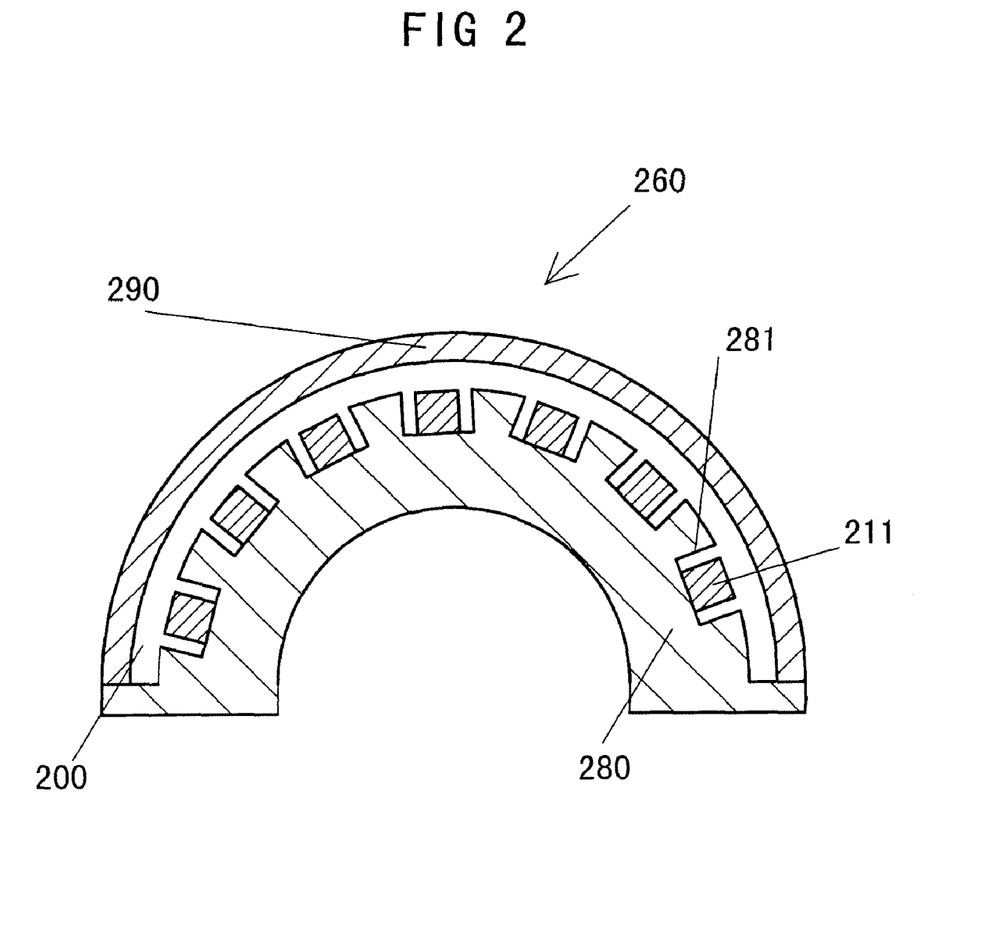
FIG. 2 is a schematic sectional view of an injection mold for manufacturing the transverse gradient coil according to the first embodiment.

FIG. 2 is a schematic sectional view of an injection mold 260 for manufacturing the transverse gradient coil 100.

The injection mold 260 includes a bottom mold 280 and a top mold 290, both of which are formed in an arced shape.

Coil grooves 281 corresponding to a coil pattern are formed on an interior surface of bottom mold 280 facing to the top mold 290. Bare copper conductor or insulated copper conductor 211 (rectangular or round shaped copper wire) is wound around coil grooves to form the coil pattern of the coil layer 110. The surface of the copper conductor 211 is cleaned with an acid solution, for example, hydrochloric acid or sulfuric acid and washed several times, grit blasted and washed, then vacuum dried at 91.2 KPa-101.346 KPa (27-30 in Hg).

The top mold 290 of the injection mold is then connected to the bottom mold 280 of the injection mold to form an enclosed injection mold. A cavity 200 is formed between the top mold 290 and the bottom mold 280, dimensions of which depend on the dimensions of the insulation layer of the transverse gradient coil according to the first embodiment.

The connected injection mold is then pre-treated. Generally, the pre-treating process includes the steps of heating the injection mold to the temperature of 80-120° C., vacuum-drying it at 91.2 KPa-101.346 KPa (27-30 in Hg) at the temperature for a certain period, for example 2 hours, and increasing and holding the temperature to 150° C.-200° C. until injection of the thermoplastic resin. However, other methods of drying could be alternatively used. In the pre-treating process, the step of increasing and holding the temperature of the injection mold at 150-200° C. until injection may be preferred since it can improve the bonding strength between the coil layer 110 and the insulation layer 130.

Pellets or powder of the thermoplastic insulation resin can be mixed, melted at a temperature in a range of 190° C.-320° C. and injected into the injection mold under a pressure in a range of 8000 psi-10000 psi.

The injected resin will flow into the cavity 200 as shown in FIG. 2 and will be held in the injection mold for 1-2 hours with a pressure much lower than injection pressure and with the temperature of the injection mold being cooled to the temperature of 30° C. The injected resin therefore solidifies and bonds to the copper conductor.

The injection mold is then cooled down and the arc shaped transverse coil is removed from the injection mold.

Figure 3:
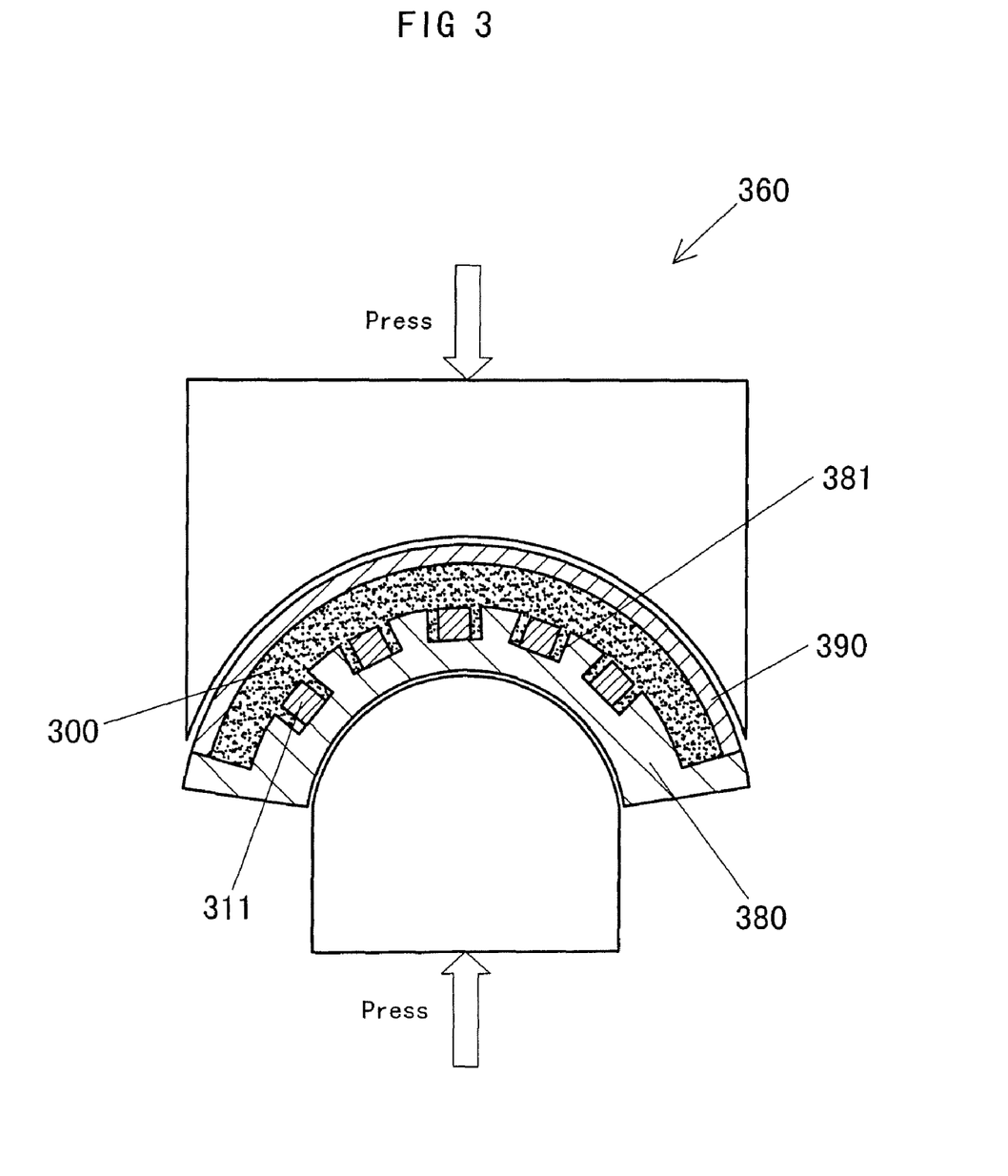
FIG. 3 is a schematic sectional view of a compression mold for manufacturing the transverse gradient coil according to the first embodiment.

In one embodiment, the transverse gradient coil 100 can be manufactured by compression molding. A compression mold 360 for manufacturing the transverse gradient coil 100 is shown in FIG. 3. The mold 360 includes a top mold 390 and a bottom mold 380, both of which are in arced shape. A cavity 300 is formed between the top mold 390 and the bottom mold 380.

Coil grooves 381 are formed on the surface of the bottom mold 380 facing to the top mold 390. Bare copper conductor or insulated copper conductor 311 (rectangular or round shaped copper wire) for providing the coil layer 110 is wound around coil grooves to form the coil pattern of the coil layer 110. The surface of the copper conductor 311 is cleaned with acid solution and washed several times then vacuum dried at 91.2 KPa-101.346 KPa (27-30 in Hg).

Pellets or powder of the thermoplastic insulation resin can then be filled in the cavity 300 of the compression mold 360.

The charged compression mold is vacuum dried at 91.2 KPa-101.346 KPa (27-30 in Hg) and at the temperature of 100° C.-120° C. to drive out moisture for about 2 hours, then is heated to a temperature higher than the glass transition temperature of the resin but lower than its melting point (i.e. in a range of 160° C.-290° C. (depending on resin grade) with a pressure of 8000-12000 psi being applied.

Once the thermoplastic resin is compressed to a desired dimension and is bonded to the copper conductors, the compression mold 360 is immediately cooled to room temperature with a lower pressure of 2000-5000 psi being applied, and is held for 2 hours.

The transverse gradient coil 130 formed by the compression molding then may be removed from the compression mold 360.

Figure 4:
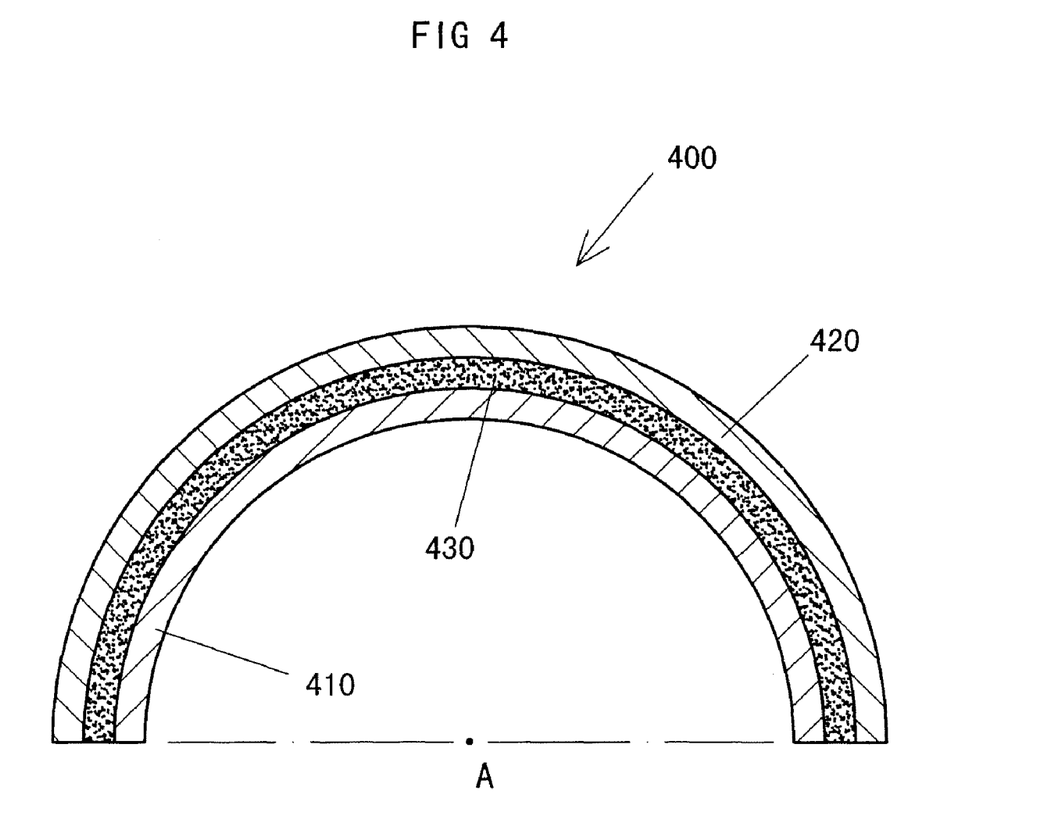
FIG. 4 is a schematic sectional view of a transverse gradient coil according to another embodiment of the invention.

FIG. 4 shows a transverse gradient coil 400 for an MRI system (not shown) according to another embodiment. The transverse gradient coil 400 comprises an inner coil layer 410, an outer coil layer 420 and an insulation layer 430 sandwiched between the inner coil layer 410 and the outer coil layer 420. Each of the inner coil layer 410, the outer coil layer 420 and the insulation layer 430 are in arced shape and they are disposed in concentric arrangement with respect to a common axis A. The inner coil layer 410 is provided with a coil pattern for X-coil, while the outer coil layer 420 is provided with a coil pattern for X-coil or for Y-coil depending upon different applications.

The insulation layer 430 can be made of thermally conductive thermoplastic insulation resins which are suitable for the insulation layer 130 as mentioned above. That is, the thermoplastic resin could be selected from the group including but not limited to ceramic filled polypropylene, ceramic filled polyphenylene sulfide (PPS), ceramic filled polybutylene terephthalate (PBT) and ceramic filled polyamide, so as to provide insulation, mechanical performance, and high thermal conductivity for the transverse gradient coil.

In one embodiment, the transverse gradient coil 400 can be manufactured by injection molding. The injection mold for the transverse gradient coil 400 may include a bottom mold and a top mold, both of which are in arced shape. Coil grooves are formed not only on the interior surface of the bottom mold but also on the interior surface of the top mold which faces to the bottom mold. Bare copper conductor or insulated copper conductor (rectangular or round shaped copper wire) is wound around the coil grooves of the bottom mold and of the top mold to form the coil patterns of the inter coil layer 410 and the outer coil layer 420. The injection molding method may then continue in the same manner as discussed with respect to FIG. 2.

Figure 5:
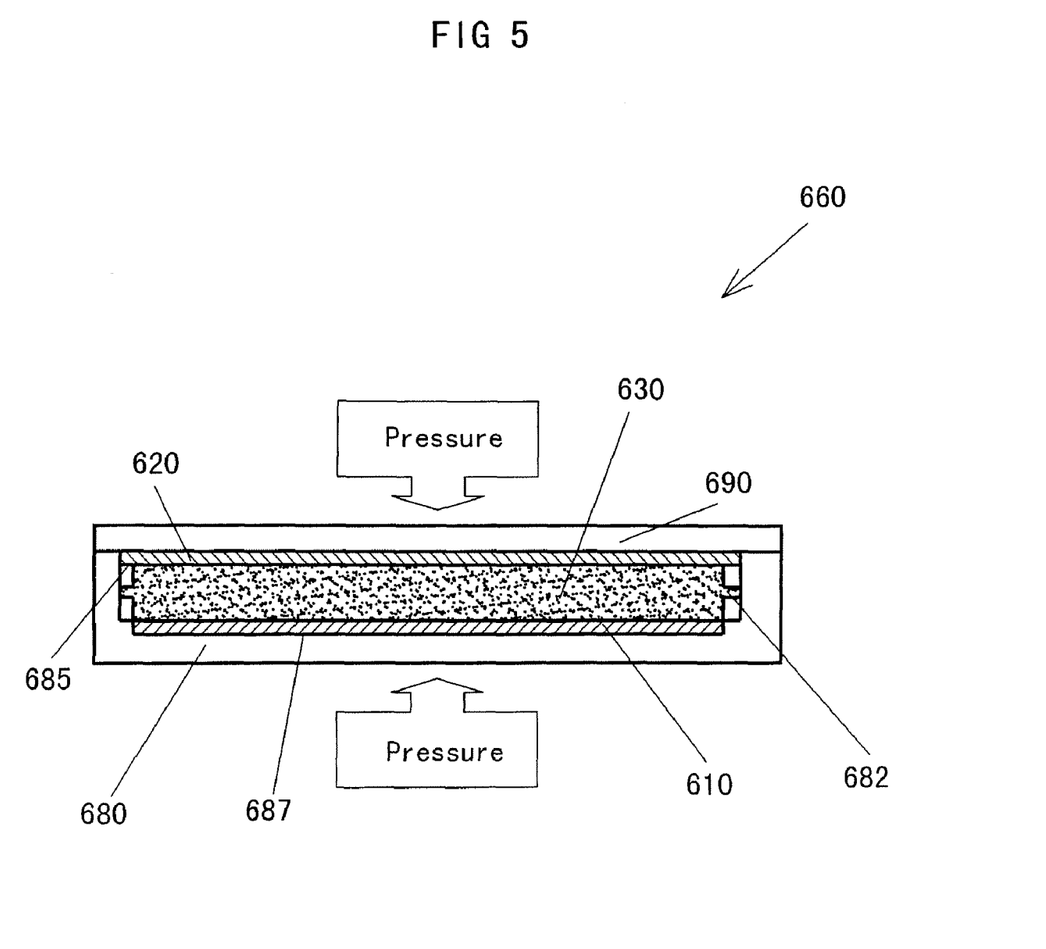
FIG. 5 is a schematic sectional view of a flat compression mold for manufacturing the transverse gradient coil according to the second embodiment.

In one embodiment, the transverse gradient coil 400 can be manufactured by compression molding. A flat compression mold 660 as shown in FIG. 5 is provided for manufacturing the transverse gradient coil 400 by compression molding. The flat compression mold 660 includes a bottom mold 680 and a top mold 690.

Figure 6:
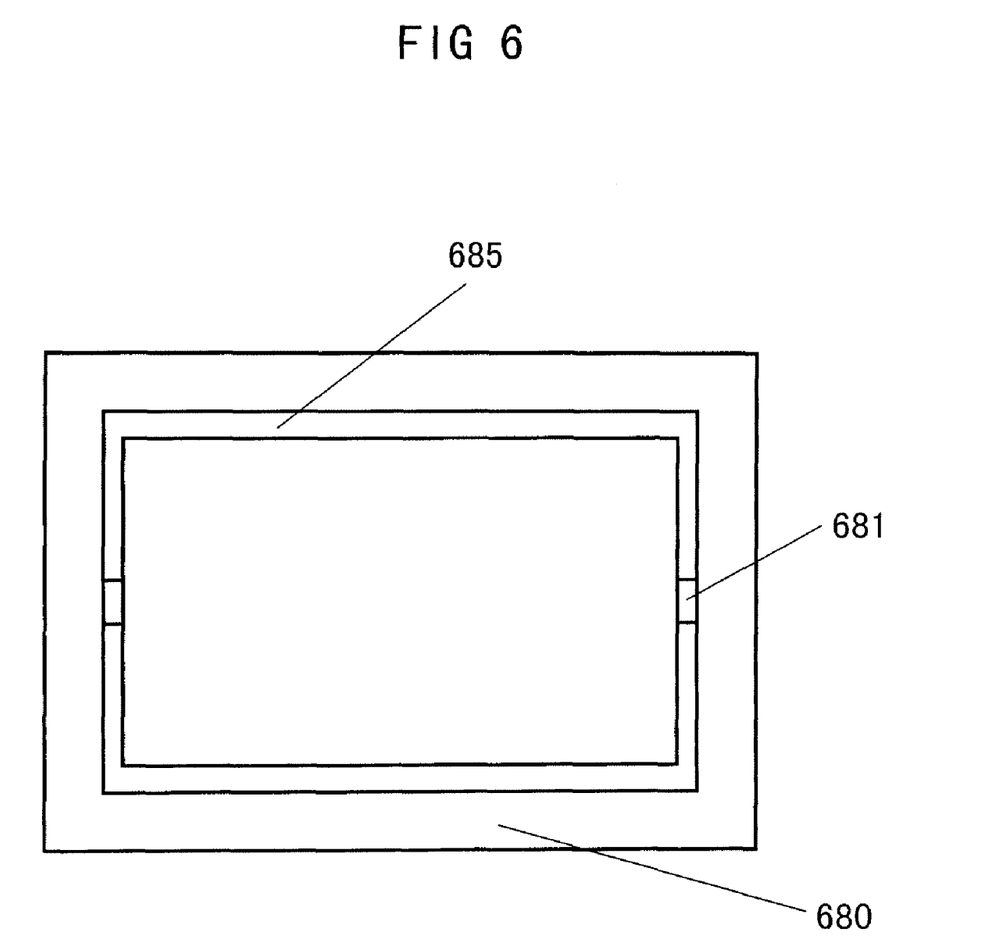
FIG. 6 is a top view of a bottom mold of the flat compression mold for manufacturing the transverse gradient coil according to the second embodiment.

As shown in FIG. 5, the bottom mold 680 is provided with a tabular cavity for receiving a first copper sheet 610, pellets or powder of the thermoplastic insulation resin as mentioned above 630 and a second copper sheet 620. As shown in FIG. 5 and FIG. 6, vertical grooves 681 and transverse grooves 682 are formed on interior surfaces of side walls of the bottom mold 680 to allow excess thermoplastic resin charged in the cavity to flow into the grooves. At the top edge of the side walls of the bottom mold 680, a step 685 is formed for receiving edges of the second copper sheet to be laid on the pellets or powder of the thermoplastic resin. Since excess pellets or powder of the thermoplastic resin are charged, the edges of the second copper sheet do not contact the step 685 before compression. After compression, since the excess resin is compressed into the vertical grooves 681 and transverse grooves 682, the edges of the second copper sheet are pressed to and therefore received by the step 685. The depth measuring from the bottom 687 to the step 685 of the compression mold equals to the thickness of the first copper sheet plus the thickness of the insulation layer 430.

At the bottom 687 of the bottom mold 680 of the compression mold is laid the first copper sheet 610. Pellets or powder of the thermoplastic resin can then be filled in the mold cavity with excess amount and the second copper sheet 620 is laid on the pellets or powder. The top mold 690 of the compression mold is then connected to the bottom mold 680.

The charged compression mold 660 is vacuum dried at 91.2 KPa-101.346 KPa (27-30 in Hg) and at the temperature of 100° C.-120° C. to drive out moisture for about 2 hours, then is heated to a temperature higher than the glass transition temperature of the thermoplastic resin but below its melting point (generally in a range of 160° C.-290° C.) with a pressure in a range of 8000-12000 psi being applied.

Once the excess thermoplastic resin flows into the vertical grooves 681 and the transverse grooves 682 so that the second copper sheet 620 is pressed down to the step 685, it is determined that the pellets or powder has been melted and compressed to a desired dimension under pressure and bonded to both of the first copper sheet 610 and the second copper sheet 620. The compression mold is then cooled with a pressure of 2000-5000 still applied until it is safe to demold.

Figure 7:
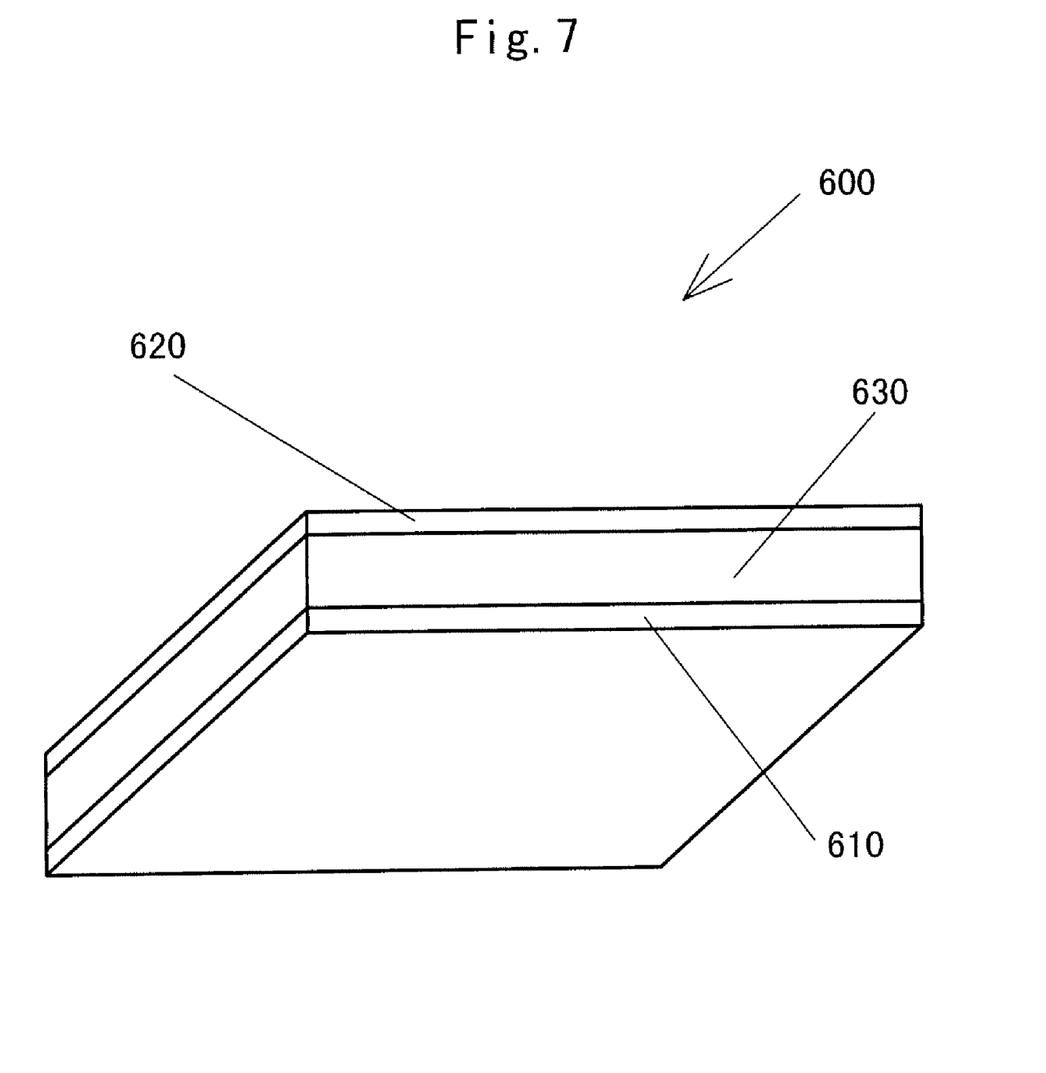
FIG. 7 shows a coil plate demolded from the compression mold as shown in FIG. 5.
Figure 8:
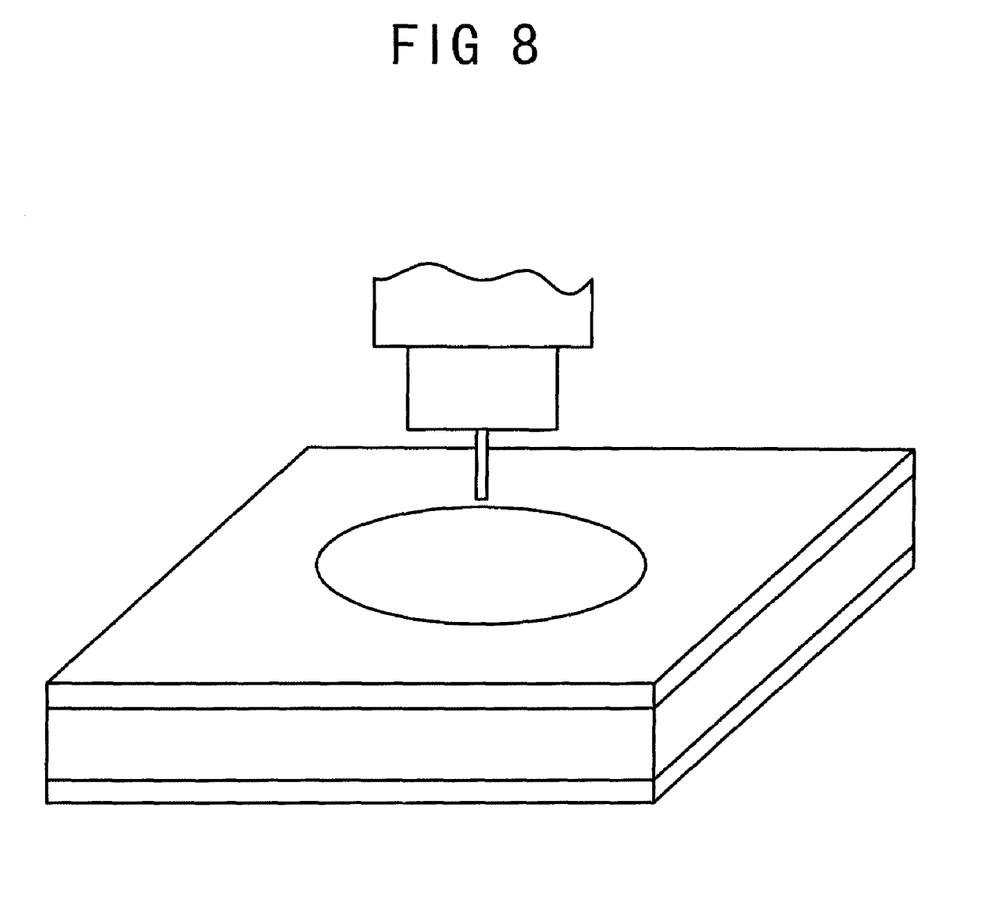
FIG. 8 is a perspective view showing that the molded coil plate is milled to a desired coil pattern.

The first copper sheet 610 and the second copper sheet 620 of this molded coil plate 600 as shown in FIG. 7 is then milled to a desired coil pattern, as shown in FIG. 8, so as to form the inner coil layer 410 and the outer coil layer 420 of the transverse gradient coil 400.

Figure 9:
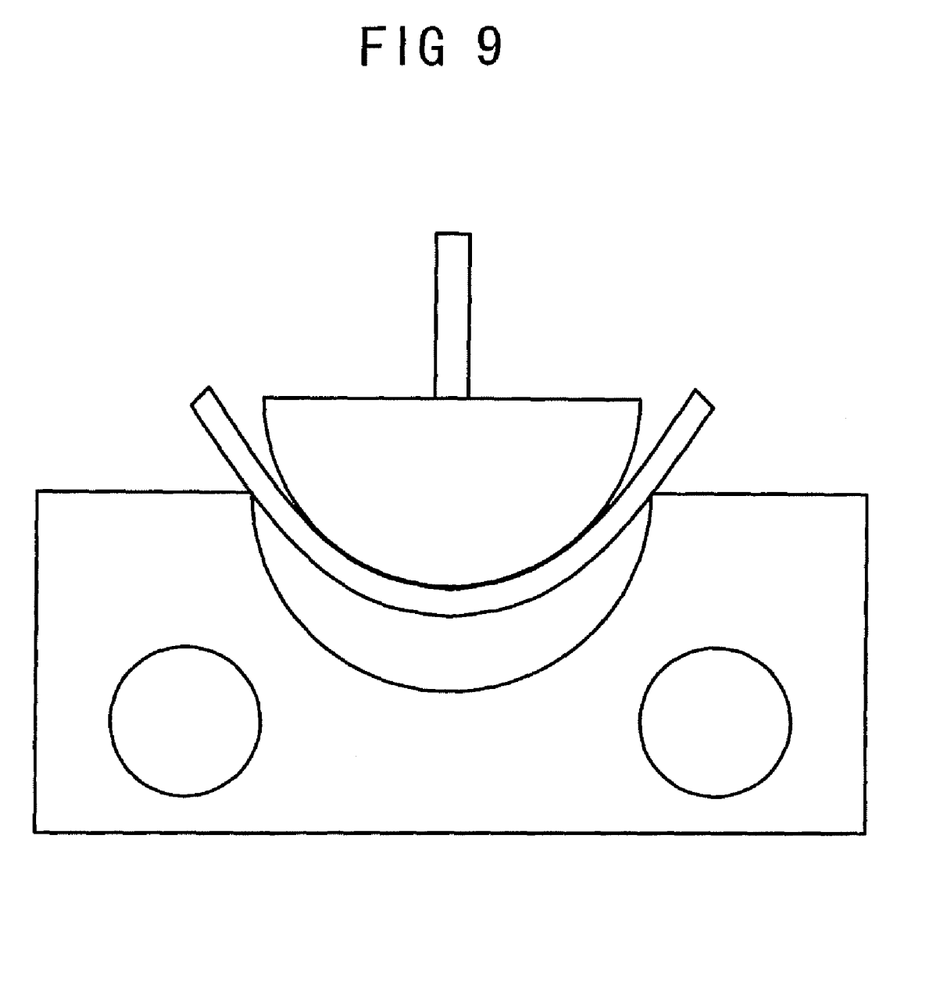
FIG. 9 shows that the coil plate with the coil pattern is thermally bended to an arced shape coil.

Subsequently, the coil plate 600 with the coil pattern is thermally bended to an arc-shaped coil, as shown in FIG. 9, so as to form the transverse gradient coil 400.

Example 1 and Example 2 are provided to further explain certain methods of injection molding.

EXAMPLE 1

The thermally conductive thermoplastic insulation resin is ceramic filled polypropylene, for example COOLPOLY® D1202.

The injection mold, for example the injection mold 260, is pre-treated. The pre-treating process includes steps of vacuum drying the injection mold at a temperature of 80° C. for 2 hrs and then increasing and holding the temperature to 150° C. until injection of the thermoplastic resin.

Pellets or powder of the thermoplastic resin are mixed and melted at a temperature in a range of 190° C.-220° C. and injected under a pressure in a range of 8000 psi-10000 psi.

Once the thermoplastic resin has been filled in the injection mold, lower the pressure to a range of 4000-5000 psi, and cool the temperature of the injection mold to 30° C., hold for 2 hrs.

The molded transverse gradient coil is then removed from the injection mold.

EXAMPLE 2

The thermally conductive thermoplastic insulation resin is ceramic filled polyamide, such as COOLPOLY® D3604.

The injection mold, for example the injection mold 260, is pre-treated. The pre-treating process includes steps of vacuum drying the injection mold at a temperature of 120° C. for 2 hrs and then increasing and holding the temperature to 200° C. until injection of the thermoplastic resin.

Pellets or powder of the thermoplastic resin are mixed and melted at a temperature in a range of 290-320° C. and injected under a pressure in a range of 10000-12000 psi.

Once the thermoplastic resin has been filled in the injection mold, lower the pressure to a range of 5000-6000 psi, and cool the temperature of the injection mold to 80° C., hold for 2 hrs, further cool the temperature of injection mold to 30° C.

The molded transverse gradient coil is then removed from the injection mold.

Example 3 and Example 4 are provided to further explain certain methods of compression molding.

EXAMPLE 3

The thermally conductive thermoplastic insulation resin is ceramic filled polypropylene, for example, COOLPOLY® D1202.

The compression mold, for example, either the compression mold 360 or the compression mold 660, is filled with pellets or powder of the thermoplastic resin.

The charged compression mold is vacuum dried at temperature of 80° C. for 2 hrs.

The compression mold is then heated up to a temperature in a range of 160° C.-200° C. with a pressure in a range of 8000 psi-10000 psi.

When it is determined that the thermoplastic resin has been melted and compressed to a desired dimension and bonded to both copper sheets, the compression mold is immediately cooled to room temperature with a lower pressure in a range of 2000 psi-3000 psi being applied, holding for 2 hrs.

The molded coil or coil plate is then removed from the compression mold.

EXAMPLE 4

The thermally conductive thermoplastic insulation resin is ceramic filled polyamide, for example, COOLPOLY® D3604.

The compression mold, for example, either the compression mold 360 or the compression mold 660, is filled with pellets or powder of the thermoplastic resin.

The charged compression mold is vacuum dried at a temperature of 120° C. for 2 hrs.

The mold is then heated up to a temperature in a range of 260° C.-290° C. with a pressure in a range of 10000 psi-12000 psi being applied.

When it is determined that the thermoplastic resin has been melted and compressed to a desired dimension and bonded to both copper sheets, the compression mold is immediately cooled to room temperature with a lower pressure in a range of 3000 psi-5000 psi, holding for 2 hrs.

The molded coil or coil plate is then removed from the mold.

It can be conceived that the transverse gradient coils need not be limited to arced shapes. Alternatively, they can be made in other shapes such as a tabular shape. Tabular-shaped transverse gradient coils can be used in an MRI system for imaging only a part of a human body. The methods as described above can be applied to manufacture the tabular transverse gradient coils if the molds with arc-shaped cavity are substituted by molds with tabular-shaped cavity.

While the invention has been described with reference to one or more embodiments of the invention, it will be understood by those skilled in the art that various changes may be made and equivalents may be substituted for elements thereof without departing from the scope of the invention. In addition, various modifications may be made to adapt a particular situation or material to the teachings of the invention without departing from the scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A transverse gradient coil for a magnetic resonance imaging system, comprising:
   a first coil layer; and
   an insulation layer made of thermoplastic insulation resin which has a thermal conductivity greater than 1.5 W/m·K, the insulation layer having one side bonded to the first coil layer,
   wherein the first coil layer and the insulation layer form an arc shape and are disposed in a concentric arrangement with respect to a common axis.

2. The transverse gradient coil in accordance with claim 1, further comprising a second coil layer, wherein the other side of the insulation layer is bonded to the second coil layer.

3. The transverse gradient coil in accordance with claim 1, wherein the thermal conductivity of the thermoplastic insulation resin of the insulation layer is greater than 2.5 W/m·K.

4. The transverse gradient coil in accordance with claim 1, wherein the thermoplastic insulation resin of the insulation layer is selected from the group consisting of ceramic filled polypropylene, ceramic filled polyphenylene sulfide, ceramic filled polybutylene terephthalate and ceramic filled polyamide.

5. The transverse gradient coil in accordance with claim 1, wherein the thermoplastic insulation resin of the insulation layer has a tensile modulus which is greater than 700 ksi and a tensile strength which is greater than 3 ksi.

6. The transverse gradient coil in accordance with claim 1, wherein the linear thermal shrinkage from 125° C. to 20° C. of the thermoplastic insulation resin is less than 1.2% and the thermal expansion coefficient from 20° C. to 80° C. is less than 40 micrometer/(meter. °C.).

7. The transverse gradient coil in accordance with claim 1, wherein the breakdown strength of the thermoplastic insulation resin of the insulation layer is greater than 400 V/mil.

8. The transverse gradient coil in accordance with claim 1, wherein the transverse gradient coil is in arced shape.

9. The transverse gradient coil in accordance with claim 1, wherein the transverse gradient coil is in tabular shape.

10. A method for manufacturing a transverse gradient coil for a magnetic resonance imaging system, comprising:
providing an injection mold which includes a bottom mold and a top mold with coil grooves being formed in at least one of the bottom mold and the top mold;
winding a copper conductor about coil grooves to form at least one coil layer of the transverse gradient coil;
pre-treating the injection mold; and
injecting melted thermoplastic insulation resin into the injection mold to form an insulation layer bonding to the at least one coil layer, wherein the thermoplastic insulation resin has a thermal conductivity greater than 1.5 W/m·K.

11. The method in accordance with claim 10, wherein the step of pre-treating includes vacuum drying the injection mold and increasing and holding the temperature of the injection mold to a range of 150-200° C. until injection of the melted thermoplastic insulation resin.

12. The method in accordance with claim 10, wherein the thermoplastic insulation resin is ceramic filled polypropylene;
the step of pre-treating comprises vacuum drying the injection mold and increasing and holding the temperature of the injection mold to 150° C. until injection of the thermoplastic insulation resin, and
the thermoplastic insulation resin is melted at a temperature in a range of 190° C.-220° C. and injected under a pressure in a range of 8000 psi-10000 psi.

13. The method in accordance with claim 10, wherein the thermoplastic insulation resin is ceramic filled polyamide;
the step of pre-treating comprises vacuum drying the injection mold and increasing and holding the temperature to 200° C. until injection of the thermoplastic insulation resin, and
the thermoplastic insulation resin is melted at a temperature in a range of 290° C.-320° C. and injected under a pressure in a range of 10000 psi-12000 psi.

14. A method for manufacturing a transverse gradient coil for a magnetic resonance imaging system, comprising:
providing a compression mold which includes a bottom mold and a top mold with coil grooves being formed in at least one of the bottom mold and the top mold;
winding a copper conductor about the coil grooves to form at least one coil layer;
filling pellets or powder of a thermoplastic insulation resin into the compression mold, wherein the thermoplastic insulation resin has a thermal conductivity greater than 1.5 W/m·K;
pressing the compression mold at a temperature higher than the glass transition temperature of the thermoplastic insulation resin but lower than its melting point until the pellets or powder is compressed to a desired dimension and bonded to the at least one coil layer.

15. The method in accordance with claim 14, wherein the pressure force applied in the step of pressing is in a range of 8000 psi-12000 psi and the temperature of the compression mold is held in a range of 160° C.-290° C.

16. The method in accordance with claim 14, wherein the thermoplastic insulation resin is ceramic filled polypropylene; and
in the step of pressing, the pressure force applied is in a range of 8000 psi-10000 psi, the temperature of the compression mold is held in a range of 160° C.-200° C.

17. The method in accordance with claim 14, wherein the thermoplastic insulation resin is ceramic filled polyamide; and
in the step of pressing, the pressure force applied is in a range of 10000 psi-12000 psi, the temperature of the compression mold is held in a range of 260° C.-290° C.

18. A method for manufacturing a transverse gradient coil for a magnetic resonance imaging system, comprising:
providing a flat compression mold in rectangular shape comprising a top mold and a bottom mold;
placing a first copper sheet at the bottom of the bottom mold;
filling pellets or powder of a thermoplastic insulation resin into the bottom mold, wherein the thermoplastic insulation resin has a thermal conductivity greater than 1.5 W/m·K;
laying a second copper sheet on the pellets or powder;
connecting the top mold to the bottom mold; and
pressing the compression mold at a temperature higher than the glass transition temperature of the thermoplastic insulation resin but lower than its melting point until the pellets or powder is compressed to a desired dimension and bonded to the first copper sheet and the second copper sheet so as to form a coil plate.

19. The method in accordance with claim 18, further comprising the step of milling the coil plate to a desired coil pattern.

20. The method in accordance with claim 19, further comprising the step of bending the coil plate with the coil pattern to form an arc shaped coil.

21. The method in accordance with claim 18, wherein the pressure force applied in the step of pressing is in a range of 8000 psi-12000 psi.

22. The method in accordance with claim 18, wherein the temperature of the compression mold in the step of pressing is held in a range of 160° C.-290° C.

23. The method in accordance with claim 18, wherein the thermoplastic insulation resin is ceramic filled polypropylene; and
in the step of pressing, the pressure force applied is in a range of 8000 psi-10000 psi, the temperature of the compression mold is held in a range of 160° C.-200° C.

24. The method in accordance with claim 18, wherein the thermoplastic insulation resin is ceramic filled polyamide; and
in the step of pressing, the pressure force applied is in a range of 10000 psi-12000 psi, the temperature of the compression mold is held in a range of 260° C.-290° C.

* * * * *